(12) United States Patent
Ahn

(10) Patent No.: US 7,772,666 B2
(45) Date of Patent: Aug. 10, 2010

(54) CMOS IMAGE SENSOR AND METHOD FOR MANUFACTURING THE SAME

(75) Inventor: Heui Gyun Ahn, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 613 days.

(21) Appl. No.: 11/616,047

(22) Filed: Dec. 26, 2006

(65) Prior Publication Data

US 2007/0152286 A1 Jul. 5, 2007

(30) Foreign Application Priority Data

Dec. 29, 2005 (KR) .................. 10-2005-0133164

(51) Int. Cl.
*H01L 31/058* (2006.01)
(52) U.S. Cl. .................. 257/444; 257/E31.022
(58) Field of Classification Search .................. 257/414, 257/E31.022
See application file for complete search history.

(56) References Cited

U.S. PATENT DOCUMENTS

2005/0194653 A1  9/2005  Hynecek et al.
2006/0214195 A1*  9/2006  Kobayashi et al. .......... 257/222
2008/0116537 A1*  5/2008  Adkisson et al. ............ 257/448

FOREIGN PATENT DOCUMENTS

JP  20020231048  3/2004
JP  2007-071931  * 4/2004

* cited by examiner

*Primary Examiner*—Zandra Smith
*Assistant Examiner*—Paul E Patton
(74) *Attorney, Agent, or Firm*—Saliwanchik, Lloyd & Saliwanchik

(57) ABSTRACT

A CMOS image sensor and a method for manufacturing the same are provided. The CMOS image sensor may be capable of improved thickness uniformity form microlenses formed at a reduced distance from the photodiodes. The CMOS image sensor can include: a semiconductor substrate on which a pixel array is formed, the pixel array including photodiodes formed on the semiconductor substrate to different depths for sensing red, green, and blue signals, respectively; an interlayer dielectric formed on the semiconductor substrate and having a trench at an upper portion of the pixel array; an insulating layer sidewall formed at a side of the trench; and a plurality of microlenses formed on the interlayer dielectric in the trench at predetermined intervals.

3 Claims, 5 Drawing Sheets

CMOS IMAGE SENSOR AND METHOD FOR MANUFACTURING THE SAME

RELATED APPLICATION(S)

This application claims priority under 35 U.S.C. §119(e) of Korean Patent Application No. 10-2005-0133164 filed Dec. 29, 2005, which is incorporated herein by reference in its entirety.

FIELD OF THE INVENTION

The present invention relates to an image sensor and a method for manufacturing the same, and more particularly, to a CMOS image sensor capable of improving the uniformity of a microlens array in the CMOS image sensor during a formation process of the microlens array, and a method for manufacturing the same.

BACKGROUND OF THE INVENTION

In general, image sensors are semiconductor devices that transform an optical image to electrical signals. Among the types of image sensors, a CMOS (complementary-metal-oxide-semiconductor) image sensor has adapted a switch mode by forming transistors for each unit pixel with a CMOS technology, and using control circuits and signal-processing circuits in conjunction with the transistors to sequentially detect outputs.

Efforts are continually being made to improve the photosensitivity of the image sensor.

For example, the CMOS image sensor is composed of a photodiodes for sensing light and a CMOS logic circuit for processing the sensed light into electric signals to convert them to data. For better photosensitivity, two methods have been proposed. In a first method, efforts are used to increase an occupied area of the photodiode with respect to the total area of the image sensor. In a second method, technologies are used to reduce an incident path of light, to form a microlens at an upper portion thereof, and to receive more light in a photodiode region.

The CMOS image sensor is classified as a 3T type, a 4T type or a 5T type according to the number of transistors formed in a unit pixel. The 3T type CMOS image sensor includes a single photodiode and three transistors, and the 4T type CMOS image sensor includes a single photodiode and four transistors. The 3T CMOS image sensor will now be described with reference to an equivalent circuit diagram and a layout thereof.

FIG. 1 is an equivalent circuit diagram of a 3T type CMOS image sensor according to the related art. FIG. 2 is a layout view showing a unit pixel of the 3T type CMOS image sensor.

As shown in FIG. 1, the unit pixel of the typical 3T CMOS image according to the related art includes one photodiode (PD) and three NMOS transistors T1, T2 and T3. The photodiode includes a cathode connected to the drain of the first NMOS transistor T1 and the gate of the second NMOS transistor T2.

Further, the sources of the first and second NMOS transistors T1 and T2 are connected to a power line that supplies a reference voltage, and the gate of the first NMOS transistor T1 is connected to a reset line that supplies a reset signal.

The source of the third NMOS transistor T3 is connected to the drain of the second NMOS transistor, and the drain of the third NMOS transistor T3 is connected to a reading circuit (not shown) through a signal line. The gate of the third NMOS transistor T3 is connected to a column selection line that supplies a selection signal SLCT.

Accordingly, the first NMOS transistor T1 functions as a reset transistor Rx, the second NMOS transistor T2 functions as a driver transistor DX, and the third NMOS transistor T3 functions as a selection transistor Sx.

As shown in FIG. 2, an active region 10 is defined for a general unit pixel of the 3T CMOS image sensor. One photodiodes 20 is formed at a wider part of the active region 10. Three gate electrodes 120, 130, 140 of the transistors overlap the remaining parts of the active region 10.

FIGS. 3A through 3F are cross-sectional views for describing a method for manufacturing a CMOS sensor having a vertical photodiodes construction according to the related art.

Referring to FIG. 3A, a pixel array 32 is formed by selectively implanting impurity ions in a semiconductor substrate 31 at a photodiode region. The pixel array 32 includes photodiodes, which are formed at the semiconductor substrate 31 to different depths and sense red (R), green (G), and blue (B) signals, respectively.

Next, a device (not shown) for processing signals and a multilayer metal wire (not shown) are sequentially formed on the semiconductor substrate 31 in which the pixel array 32 is formed. The multilayer metal wire functions to connect respective parts to each other.

Then, an interlayer dielectric 33 is formed at an entire surface of the semiconductor substrate 31. An oxide layer is formed on the interlayer dielectric 33 to obtain a passivation layer 34 in order to protect the device from moisture or an externally physical shock.

Referring to FIG. 3b, after a photoresist 35 is coated on the passivation layer 34, the photoresist 35 is selectively patterned to expose an upper portion of the pixel array 32 by exposure and developing processes.

As shown in FIG. 3C, the passivation layer 34 formed at an upper portion of the pixel array 32 is selectively removed using the patterned photoresist 35 as a mask.

The process for selectively removing the passivation layer 34 includes a pad opening process for exposing a metal pad, which is formed at a pad region of the semiconductor substrate 31.

Referring to FIG. 3D, the photoresist 35 is removed, and an interlayer dielectric 33 disposed at an upper portion of the pixel array 32 is selectively removed through a dry etch by performing photolithography and etch processes, thereby forming a trench 36 to a predetermined depth from a surface of the interlayer dielectric.

As shown in FIG. 3E, a photoresist layer 37a for a microlens is coated on an entire surface of the semiconductor substrate 31.

Referring to FIG. 3F, after the photoresist layer 37a for a microlens is selectively patterned, a reflow process is performed to form a plurality of microlenses 37 at predetermined intervals on the interlayer dielectric 33 in the trench 36.

However, in the conventional method for manufacturing the semiconductor device, as shown in FIG. 3E, the interlayer dielectric 33 and the passivation layer 34 disposed at a side of the trench 36 have a vertical profile when coating the photoresist layer 37a. Accordingly, the photoresist layer 37a is not coated with uniform thickness and causes striation.

BRIEF SUMMARY

Accordingly, embodiments of the present invention are directed to a CMOS image sensor and a method for manufacturing the same that substantially obviates one or more problems due to limitations and disadvantages of the related art.

An object of embodiment of the present invention is to provide a CMOS image sensor and a method for manufacturing the same, which is capable of reducing the distance of light passed through a microlens to a photodiode and preventing the occurrence of striation upon coating a photoresist layer for the microlens.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CMOS (complementary metal oxide semiconductor) image sensor comprising: a semiconductor substrate on which a pixel array is formed, the pixel array comprising photodiode formed on the semiconductor substrate to different depths for sensing red, green, and blue signals, respectively; an interlayer dielectric formed at an upper portion of the pixel array having a trench of a predetermined depth formed therein; an insulating layer sidewall formed at an inner side of the trench of the interlayer dielectric; and a plurality of microlenses formed on the interlayer dielectric in the trench at predetermined intervals.

In another aspect of the present invention, there is provided a method for manufacturing a CMOS image sensor comprising the steps of: forming a pixel array for sensing red, green, and blue signals on a semiconductor substrate; sequentially forming an interlayer dielectric and a passivation layer on the semiconductor substrate including the pixel array; selectively removing the passivation layer and the interlayer dielectric at an upper portion of the pixel array to form a trench to a predetermined depth from a surface; forming an insulating layer sidewall at an inner side of the trench of the interlayer dielectric; and forming a plurality of microlenses on the interlayer dielectric in the trench.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, the image sensor and a method for manufacturing the same according to an embodiment of the present invention will be described with reference to the accompanying drawings in detail.

Figure 1:
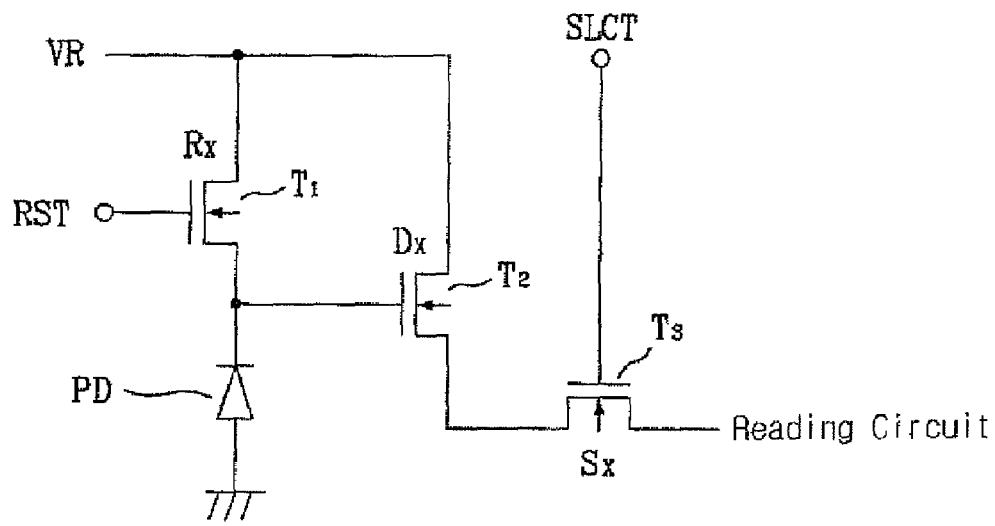
FIG. 1 is an equivalent circuit diagram of a 3T CMOS image sensor according to the related art.
Figure 2:
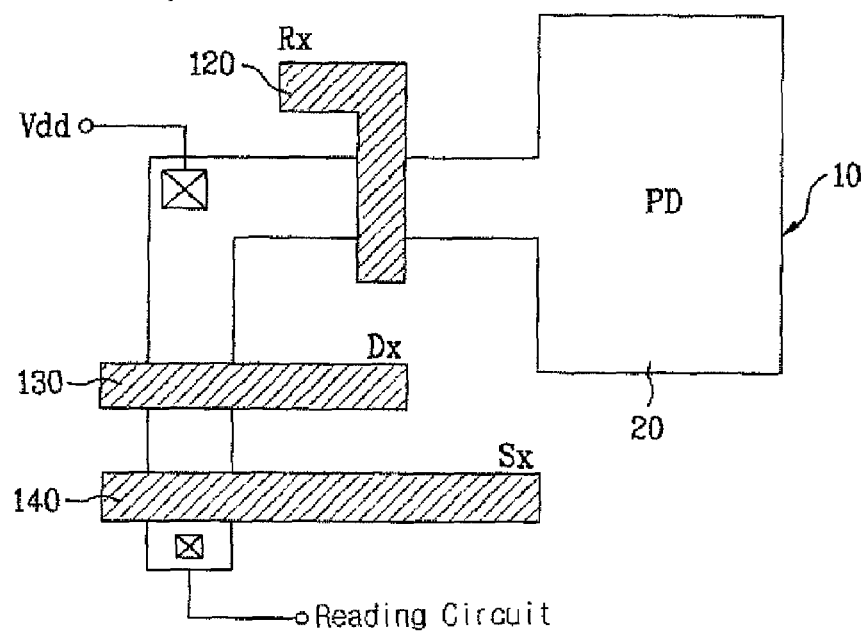
FIG. 2 is a layout view showing a unit pixel of the 3T CMOS image sensor.
Figure 3A:
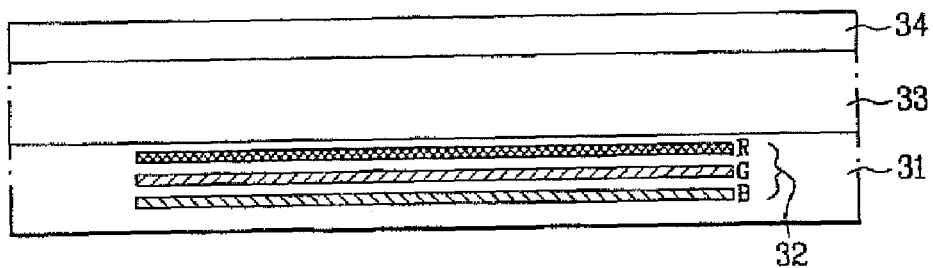
FIGS. 3A through 3F are cross-sectional views for describing a method for manufacturing a CMOS sensor according to the related art.
Figure 3B:
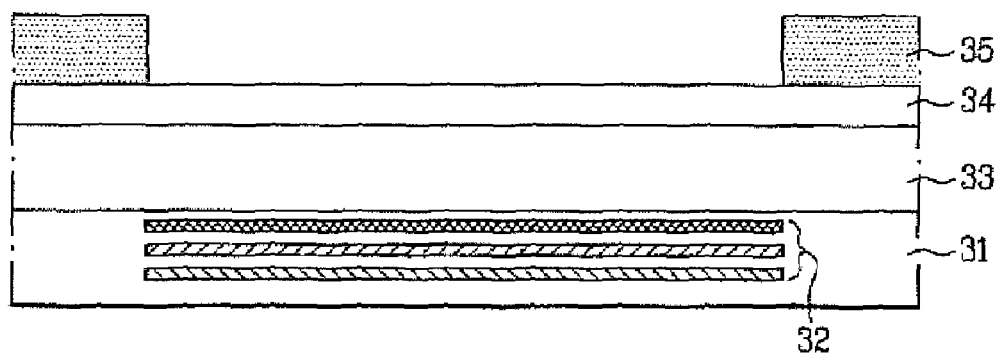
Figure 3C:
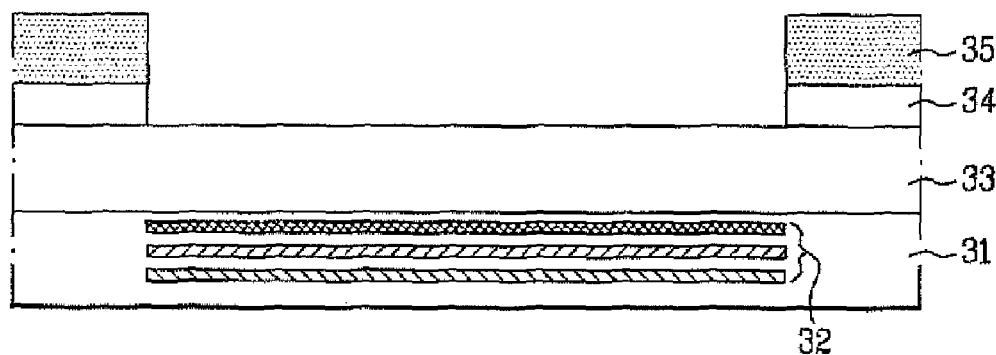
Figure 3D:
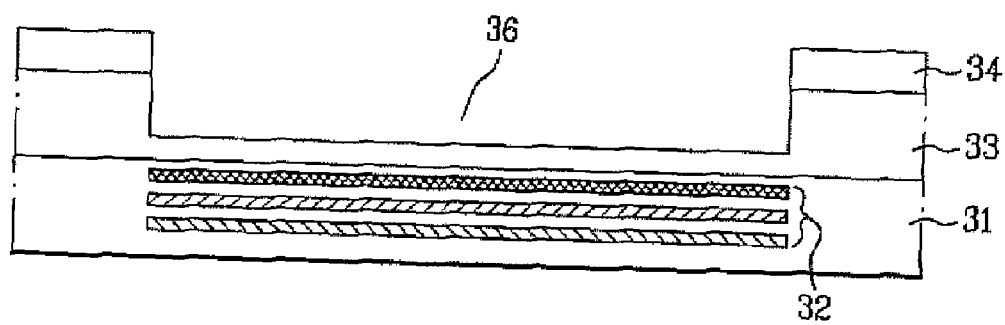
Figure 3E:
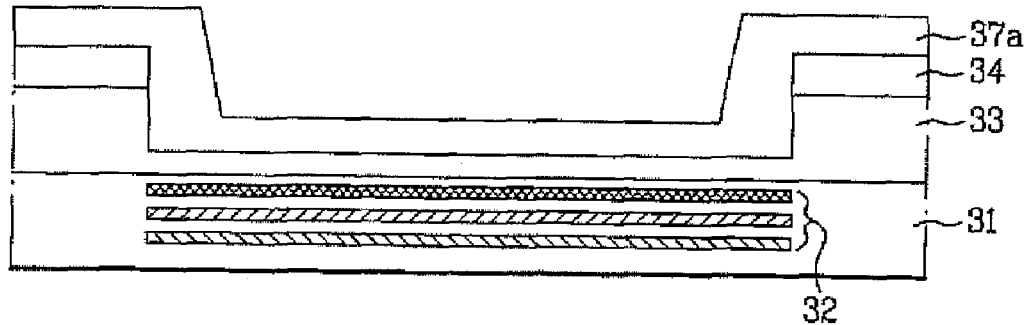
Figure 3F:
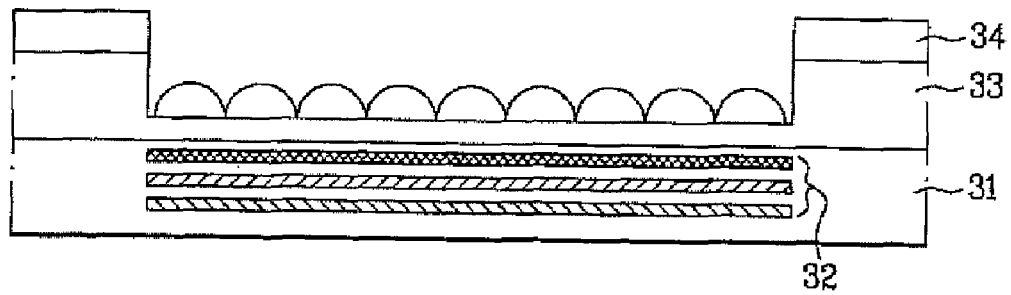
Figure 4A:
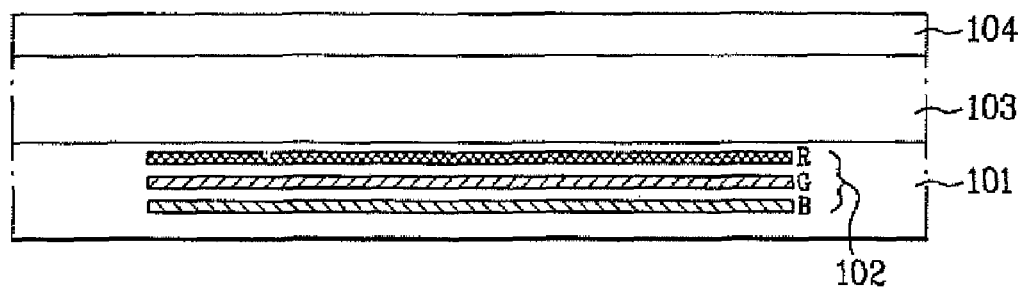
FIGS. 4A through 4G are cross-sectional views for describing a method for manufacturing a CMOS sensor according to an embodiment the present invention.
Figure 4B:
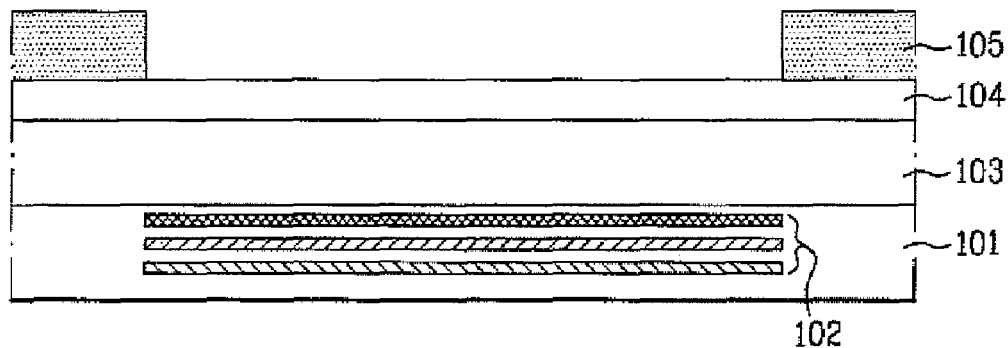
Figure 4C:
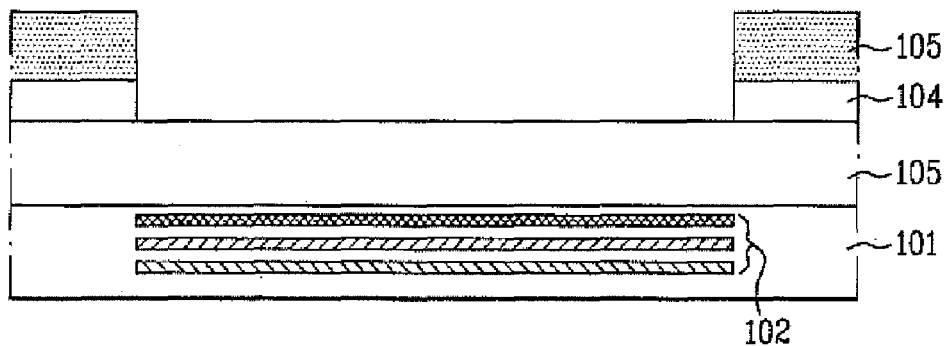
Figure 4D:
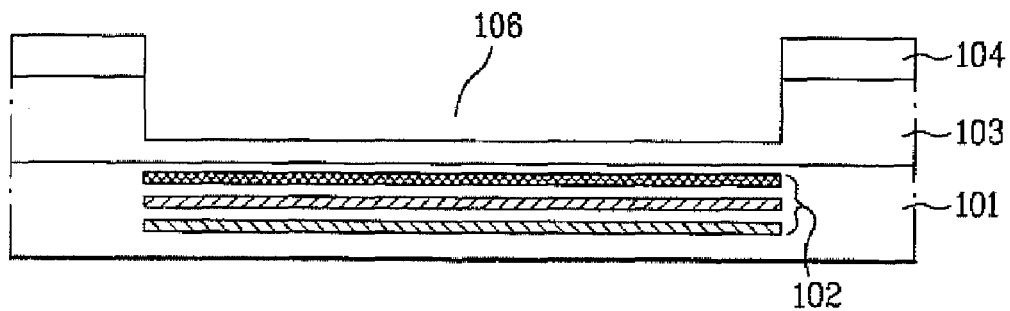
Figure 4E:
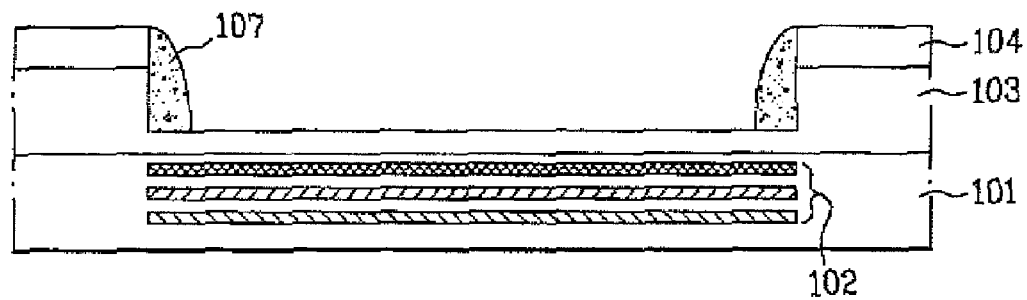
Figure 4F:
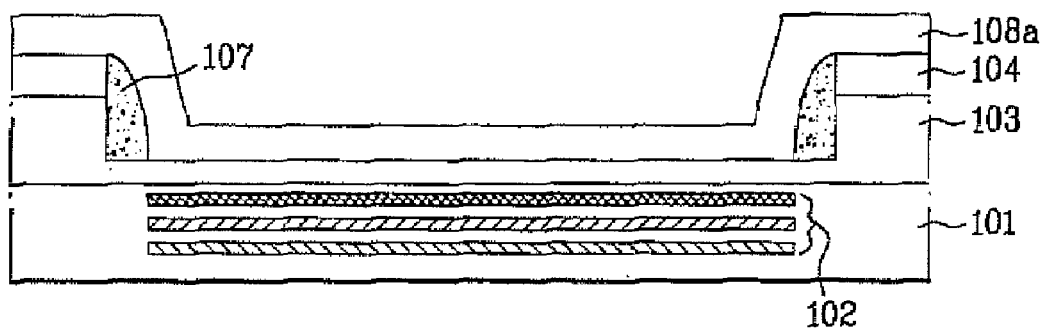
Figure 4G:
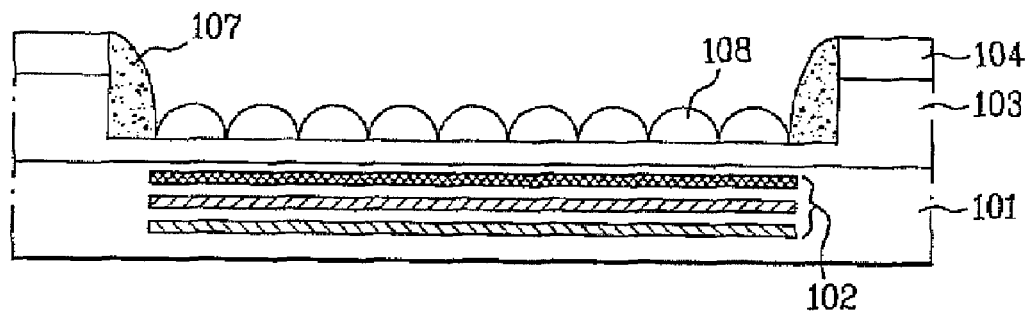

FIG. 4g is a cross-sectional view showing a CMOS image sensor according to an embodiment the present invention.

As shown in FIG. 4g, the CMOS image sensor comprises a semiconductor substrate 101, an interlayer dielectric 103, an insulating layer sidewall 107, and a plurality of microlenses 108. A pixel array can be formed in the semiconductor substrate 101. The pixel array includes photodiodes, which are formed on the semiconductor substrate 101 to different depths and sense red R, green G, and blue B signals, respectively. The interlayer dielectric 103 can be formed on the semiconductor substrate 101 to have a trench of a predetermined depth at an upper portion of the pixel array. The insulating layer side wall 107 can be formed at an inner side of the trench of the interlayer dielectric 103. The plurality of microlens 108 can be formed on the interlayer dielectric 103 in the trench 106 at predetermined intervals.

A plurality of devices and metal wires can be formed on the semiconductor substrate 101 except for above the pixel array 102. A passivation layer 104 can be further formed thereon for protecting a device from moisture and external physical shock.

The insulating layer side wall can have a slope angle ranging from 40 to 70 degrees.

FIGS. 4A through 4G are cross-sectional views for describing a method for manufacturing a CMOS sensor according to an embodiment of the present invention.

Referring to FIG. 4A, a pixel array can be formed by selectively implanting impurity ions in the semiconductor substrate 101. The pixel array 102 includes photodiodes, which are formed at a photodiodes region to have different depths and can sense red R, green G, and blue B signals, respectively.

Here, a red R photodiode can be formed at the deepest position, and a green G photodiode and a blue B photodiode can be sequentially formed on the red photodiode.

Further, the red R photodiode may be formed to a predetermined depth in a surface of the semiconductor substrate 101, and the green G photodiode may be formed to a predetermined depth in a surface of a first epitaxial layer, which is formed by a first epitaxial process of the semiconductor substrate 101. Moreover, the blue B photodiode can be formed to a predetermined depth in a surface of a second epitaxial layer, which is formed on the first epitaxial layer by a second epitaxial process of the semiconductor substrate 101.

Next, a device (not shown) for processing signals and multilayer metal wiring (not shown) can be sequentially formed on the semiconductor substrate 101 in which the pixel array 102 is formed. The multilayer metal wiring functions to connect respective parts to each other.

Then, an interlayer dielectric 103 can be formed on an entire surface of the semiconductor substrate 101. An oxide layer can be formed on the interlayer dielectric 103 to form a passivation layer 104 for protecting the device from moisture or an external physical shock.

Referring to FIG. 4B, after a photoresist 105 is coated on the passivation layer 104, the photoresist 105 can be selectively patterned to expose the passivation layer 104 at an upper portion of the pixel array 102 by exposure and developing processes.

Referring to FIG. 4C, the passivation layer 104 formed at the upper portion of the pixel array 102 can be selectively removed using the patterned photoresist 105 as a mask.

In a further embodiment, the process for selectively removing the passivation layer 104 can include a pad opening process for exposing a metal pad, which is formed at a pad region of the semiconductor substrate 101.

Referring to FIG. 4D, the photoresist 105 can be removed, and the interlayer dielectric 103 disposed at the upper portion of the pixel array 102 can be selectively removed through a dry etch by performing photolithography and etch processes, thereby forming a trench 106 to a predetermined depth from a surface.

Here, a reason of forming the trench 106 in the interlayer dielectric 103 at an upper portion of the pixel array 102 is for reducing the distance between a microlens and the pixel array 101 in order to improve the sensitivity.

Although the embodiment described above indicates that the passivation layer 104 and the interlayer dielectric 103 are removed by separate photolithography and etch processes, the present invention is not limited thereto. For example, the trench can be formed using the photoresist 105 as a mask without removing the photoresist 105.

In another embodiment, the trench may be formed by selectively removing the interlayer dielectric 103 using the passivation layer 104 as a hard mask layer.

Referring to an insulating layer sidewall 107 can be formed at sidewalls of the interlayer dielectric 103 and the passivation layer 104 by coating an entire surface of the semiconductor substrate 101 having the trench 106 with an insulating layer, and then etching back the insulating layer.

A reason for forming the insulating layer sidewall 107 is to reduce the rapid slope of a side of the trench 106, which is formed at the interlayer dielectric 103.

It is preferred that the insulating layer sidewall has a slope angle ranging from 40 to 70 degrees. So as to do this, in a specific embodiment the insulating layer is preferably formed to have a thickness ranging from 1 to 2 μm.

The insulating layer can be formed of an HDP oxide layer, an oxide system PSG or USG, a PETEOS layer, or a silicon nitride $Si_3N_4$.

Referring to FIG. 4F, an entire surface of the semiconductor substrate 101 including the insulating layer sidewall 107 and the trench 106 can be coated with a photoresist layer 108a for a microlens.

Here, upon coating the entire surface of the semiconductor substrate 101 with a photoresist layer 108a for a microlens, because a side of the trench 106 has a predetermined slope due to the insulating layer sidewall 107, no striation is formed in the photoresist layer 108a, and the entire surface of the semiconductor substrate 101 can be coated with a photoresist layer 108a having a uniform thickness.

Referring to FIG. 4G, after the photoresist layer 108a for the microlens is selectively patterned, a reflow process can be performed to form a plurality of microlenses 108 at predetermined intervals on the interlayer dielectric 103 in the trench 106.

Here, the reflow process can be carried out by a hot plate or a furnace. At this time, a curvature of the microlens 108 changes according to constricting and heating methods. The collimating effect also varies according to the curvature of the microlens 108.

Next, infrared rays can be irradiated to the microlens 108 to cure the microlens 108. Here, the microlens 108 can maintain an optimal curvature radius by irradiating the infrared rays to the microlens 108.

It will be apparent to those skilled in the art that various modifications and variations can be made in the present invention. Thus, it is intended that the present invention covers the modifications and variations of this invention provided they come within the scope of the appended claims and their equivalents.

As is clear from the forgoing description, the CMOS image sensor and a method for manufacturing the same according to embodiments of the present invention have following advantages.

That is, because microlenses are formed in a trench, a path of light being incident to a photodiodes through a microlens is reduced to increase the efficiency of the light. In addition, because an insulating layer sidewall is formed at a side of a trench, during a coating of the photoresist layer for a microlens, striation can be prevented from occurring, thereby forming the microlens with uniform thickness.

It should be understood that the examples and embodiments described herein are for illustrative purposes only and that various modifications or changes in light thereof will be suggested to persons skilled in the art and are to be included within the spirit and purview of this application.

I claim:

1. A CMOS (complementary metal oxide silicon) image sensor, comprising:
   a pixel array formed in a semiconductor substrate;
   an interlayer dielectric formed on the semiconductor substrate and having a trench at an upper portion of the pixel array;
   an insulating layer sidewall disposed only at sidewalls of the trench of the interlayer dielectric; and
   a plurality of microlenses formed on the interlayer dielectric in the trench.

2. The CMOS image sensor according to claim 1, further comprising a passivation layer formed on the interlayer dielectric except for at the upper portion of the pixel array.

3. The CMOS image sensor according to claim 1, wherein the insulating layer sidewall has a slope angle ranging from 40 to 70 degrees.

* * * * *